United States Patent
Ioana

(10) Patent No.: US 10,191,103 B2
(45) Date of Patent: Jan. 29, 2019

(54) METHOD OF LOCATING A SOURCE OF TRANSIENT SIGNALS IN A DISPERSIVE ENVIRONMENT

(71) Applicant: Institut Polytechnique de Grenoble, Grenoble (FR)

(72) Inventor: Cornel Ioana, Brignoud (FR)

(73) Assignee: INSTITUT POLYTECHIQUE DE GRENOBLE, Grenoble (FR)

( * ) Notice: Subject to any disclaimer, the term of this patent is extended or adjusted under 35 U.S.C. 154(b) by 158 days.

(21) Appl. No.: 15/111,702

(22) PCT Filed: Jan. 6, 2015

(86) PCT No.: PCT/EP2015/050106
§ 371 (c)(1),
(2) Date: Jul. 14, 2016

(87) PCT Pub. No.: WO2015/106988
PCT Pub. Date: Jul. 23, 2015

(65) Prior Publication Data
US 2016/0327604 A1    Nov. 10, 2016

(30) Foreign Application Priority Data
Jan. 16, 2014   (FR) .................... 14 50348

(51) Int. Cl.
*G01R 31/08*   (2006.01)

(52) U.S. Cl.
CPC .......... *G01R 31/083* (2013.01); *G01R 31/08* (2013.01); *G01R 31/088* (2013.01)

(58) Field of Classification Search
None
See application file for complete search history.

(56) References Cited

U.S. PATENT DOCUMENTS

| | | | |
|---|---|---|---|
| 8,474,320 B2 * | 7/2013 | Kordon | G01R 31/083 324/536 |
| 2007/0156339 A1 | 7/2007 | Oettinger | |
| 2012/0006117 A1 * | 1/2012 | Kordon | G01R 31/083 73/587 |

FOREIGN PATENT DOCUMENTS

| | | |
|---|---|---|
| DE | 10 2010 013613 A1 | 12/2011 |
| WO | 2005/073752 A1 | 11/2011 |

OTHER PUBLICATIONS

Samantaray, S.R., Phase-Space-Based Fault Detection in Distance Relaying, IEEE Transactions on Power Delivery, IEEE Service Center, New York, NY, US, vol. 26, No. 1, Jan. 1, 2011 (Jan. 1, 2011), pp. 33-41, XP011340575.

(Continued)

*Primary Examiner* — Aditya Bhat
(74) *Attorney, Agent, or Firm* — Kevin R. Erdman; Brannon Sowers & Cracraft PC

(57) ABSTRACT

The invention relates to a method of locating in a dispersive medium (5) a source (7) of pulses ($s_1$, $s_2$) by at least one pair of sensors (1, 2), the method comprising the following steps: at the level of each sensor (1, 2), detecting a pulse ($s_1$, $s_2$) originating from the source (7); for each of said pulses, constructing a phase diagram on the basis of N vectors of which the co-ordinates correspond to the amplitude of the pulse ($s_1$, $s_2$) at successive sampling instants $t_i$; and for each pair of sensors, calculating the ratio between the distances $L_1$ and $L_2$ of each sensor from the source through the formula (I) where (II) and (III) are the norms of the vectors (IV) and (V) of the phase diagrams corresponding to the pulses detected by the sensors (1, 2).

$$\frac{L_1}{L_2} = \sum_{i=1}^{N} |\vec{r_1(t_i)}| \Big/ \sum_{i=1}^{N} |\vec{r_2(t_i)}| \qquad \text{(I)}$$

$$|\vec{r_1(t_i)}| \qquad \text{(II)}$$

$$|\vec{r_2(t_i)}| \qquad \text{(III)}$$

$$\vec{r_1(t_i)} \qquad \text{(IV)}$$

$$\vec{r_2(t_i)} \qquad \text{(V)}$$

20 Claims, 4 Drawing Sheets

(56) References Cited

OTHER PUBLICATIONS

Birleanu, Florin-Mariana, et al., A Vector Approach to Transient Signal Processing, Information Science, Signal Processing and Their Applications (ISSPA), 2012 11th International Conference on, IEEE, Jul. 2, 2012 (Jul. 2, 2012), pp. 1141-1146, XP032241559.
European Patent Office, International Search Report (and translation) of PCT/EP2015/050106, dated Mar. 2, 2015, Rijswijk, NL.
European Patent Office, Written Opinion (French language version only) of PCT/EP2015/050106, dated Mar. 2, 2015, Munich, DE.
European Patent Office, Written Opinion (French language version only) of PCT/EP2015/050106, Mar. 2, 2015, Munich, DE.

* cited by examiner

METHOD OF LOCATING A SOURCE OF TRANSIENT SIGNALS IN A DISPERSIVE ENVIRONMENT

CROSS-REFERENCE TO RELATED APPLICATIONS

The present application is a National Stage of PCT International Application Serial Number PCT/EP2015/050106, filed Jan. 6, 2015, claims priority under 35 U.S.C. § 119 of France, Patent Application Serial Number 14/50348, filed Jan. 16, 2014, the disclosures of which are incorporated by reference herein.

BACKGROUND

The present disclosure relates to a method for locating a pulse source in a dispersive medium.

DISCUSSION OF RELATED ART

In transport lines, for example, for electric power, water, or data, different phenomena may result in the generation of transients (pulses) at one point of the lines. It would be desirable to detect and locate the area in which these pulses are generated.

As an example, in a power cable, a fault in the cable isolation may result in the occurrence of partial discharges, each discharge causing the generation of a pulse having a duration, or width, generally shorter than 1 µs.

Locating the pulse source enables to locate the fault and thus to replace or to repair the cable section affected by the fault. An error in the estimation of the exact position of the pulse source may result in taking action on a wrong cable portion and in having to repeat the maintenance operation.

FIG. 1 schematically shows a device capable of locating a pulse source on a line.

Two sensors 1 and 2 are arranged on an electric cable 5, on either side of an electric pulse source 7. Each sensor has a communication unit (not shown) and a signal processing unit (not shown).

A known cable length L, separates sensor 1 from sensor 2. The cable lengths, $L_1$ and $L_2$, separating source 7 respectively from sensor 1 and from sensor 2, are to be estimated.

When a partial discharge 10 occurs at the level of source 7, pulses $s_1$ and $s_2$ propagate all the way to sensors 1 and 2. In the considered example, length $L_1$ being greater than length $L_2$, pulse $s_1$ is received by sensor 1 a time $\Delta t$ after pulse $s_2$ has been received by sensor 2. Interval $\Delta t$ is inversely proportional to the pulse propagation speed in the cable and proportional to the difference between lengths $L_1$ and $L_2$. By measuring $\Delta t$, knowing the speed and the length of cable L between the sensors, the length $L_1$ or $L_2$, and thus the position of source 7 on cable 5, can be calculated.

To measure $\Delta t$, sensors 1 and 2 should be synchronized by means of systems such as GPS ("Global Positioning System") modules, radio modems, or optical fiber. A synchronization delay between sensors 1 and 2 causes an error in $\Delta t$ and thus in the exact position of source 7. As an example, for a propagation speed v=1.6*10$^8$ m.s$^{-1}$, a 160-ns error in the value of $\Delta t$ causes an error in the source position equal to 25.6 m.

Documents "IEEE TRANSACTIONS ON POWER DELIVERY, IEEE SERVICE CENTER, NEW-YORK, N.Y., US, vol. 26, n°1, Jan. 1, 2011 (Jan. 1, 2011), pages 33-41" DE 10 2010 013613, WO 2005/073752, and "INFORMATION SCIENCE, SIGNAL PROCESSING AND THEIR APPLICATIONS (ISSPA), 2012 11$^{TH}$ INTERNATIONAL CONFERENCE ON, IEEE, Jul. 2, 2012 (Jul. 2, 2012), pages 1141-1146" describe various fault location systems.

SUMMARY

It is an aim herein to reduce the error in the location of the source.

Thus, an embodiment provides a method of locating in a dispersive environment a pulse source by means of at least one pair of sensors, the method comprising the steps of: at the level of each sensor, detecting a pulse originating from the source; for each of said pulses, constructing a phase diagram from N vectors having their coordinates corresponding to the pulse amplitude at successive sampling times $t_i$; and for each pair of sensors, calculating the ratio between distances $L_1$ and $L_2$ of each sensor to the source by formula:

$$L_1/L_2 = \sum_{i=1}^{N} |\vec{r_1(t_i)}| \bigg/ \sum_{i=1}^{N} |\vec{r_2(t_i)}|$$

where $$|\vec{r_1(t_i)}| \text{ and } |\vec{r_2(t_i)}|$$

are the norms of vectors $$\vec{r_1(t_i)} \text{ and } \vec{r_2(t_i)}$$

of the phase diagrams corresponding to the pulses detected by the sensors.

According to an embodiment, the dispersive environment is a guided environment.

According to an embodiment, the source is located by a pair of sensors, distance L between the sensors being known.

According to an embodiment, the dispersive environment is an electric cable.

According to an embodiment, the coordinates of the vectors of the phase diagrams correspond to three successive sampling times.

According to an embodiment, the detection of a pulse at the level of each sensor comprises the steps of: dividing a signal received by the sensor into portions of a same duration; filtering each portion with a plurality of M bandpass filters having different central frequencies $f_j$; calculating an average energy level associated with each frequency $f_j$ of a portion; calculating a spectral distance $D_{W/W+1}$ between first and second successive portions; and comparing the spectral distance $D_{W/W+1}$ with a threshold.

According to an embodiment, the threshold value is set during a prior calibration step.

According to an embodiment, the spectral distance $D_{W/W+1}$ is calculated based on the following formula:

$$D_{W/W+1} = \sqrt{\left(\sqrt{\sum_{j=1}^{M}(X^{W+1}(f_j))^2} - \sqrt{\sum_{j=1}^{M}(X^{W}(f_j))^2}\right)^2}$$

where $X^W(f_j)$ and $X^{W+1}(f_j)$ are the average energy levels corresponding to frequency $f_j$ respectively of the first portion and of the second portion.

According to an embodiment, the duration of a portion is in the range from 5 to 15 µs.

According to an embodiment, the pitch separating two successive sampling times is in the range from 1 to 50 ns.

BRIEF DESCRIPTION OF THE DRAWINGS

The foregoing and other features and advantages will be discussed in detail in the following non-limiting description of specific embodiments in connection with the accompanying drawings, among which.

For clarity, the same elements have been designated with the same reference numerals in the different various drawings.

DETAILED DESCRIPTION

The embodiments described in detail hereafter aim at locating a source of electric pulses corresponding to partial discharges at one point of an electric cable. More generally, the method applies to locating any type of pulse source in any type of dispersive environment, be it guided or not. Another example of a guided dispersive environment is a water pipe. In this case, the pulses to be detected are not electric pulses but overpressure pulses. In the case of a non-guided dispersive environment, three sensors at least are used and the position of the pulse source is determined by triangulation based on the ratios between the distances from the source to each of the sensors. An example of a non-guided dispersive environment is a stressed mechanical part where internal breakage areas are desired to be located, the sensors then being vibration sensors or sound sensors.

Figure 2:
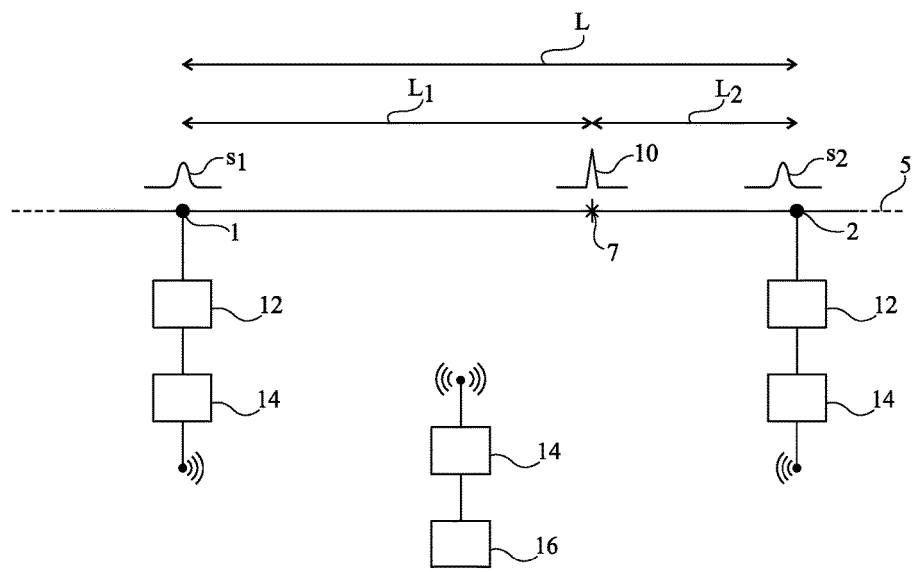
FIG. 2 schematically shows an embodiment of a device for locating a source of electric pulses in a cable.

FIG. 2 schematically illustrates an embodiment of a device for detecting a source of electric pulses in an electric cable.

The device comprises two sensors, 1 and 2, arranged at a distance L from each other on an electric cable 5, on either side of a source of electric pulses 7. Each sensor is associated with a signal processing unit 12 and with a communication unit 14. The device further comprises a computing unit 16 associated with communication unit 14. Computing unit 16 receives data from the sensor. Communication unit 14 may be a wired or wireless unit, for example, an optical fiber or powerline communication connection.

The cable lengths $L_1$ and $L_2$ separating source 7 from sensors 1 and 2 are to be estimated. When an electric discharge 10 occurs at the level of source 7, pulses $s_1$ and $s_2$, initially identical, respectively propagate towards sensor 1 and towards sensor 2.

Figure 1:
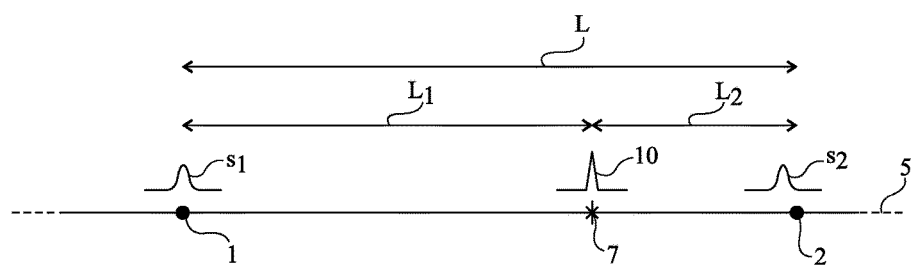
FIG. 1, previously described, schematically shows a device capable of locating a source of electric pulses a cable.
Figure 3:
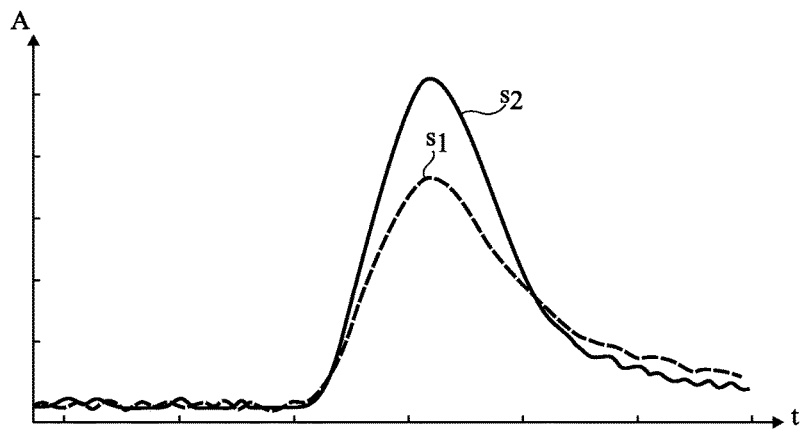
FIG. 3 shows the shape of pulses detected at the level of the sensors of FIG. 2.

FIG. 3 shows the shape of pulses $s_1$ and $s_2$ placed over each other. Pulse $s_1$ is more attenuated and more deformed than pulse $s_2$. This is the consequence of the fact that propagation distance $L_1$ of pulse $s_1$ is greater than propagation distance $L_2$ of pulse $s_2$ and of the fact that cable 5 is a dispersive environment It is here provided to determine distances $L_1$ and $L_2$ from the shape difference of pulses $s_1$ and $s_2$ rather than from the propagation time difference between these pulses. Thus, it is not necessary to synchronize sensors 1 and 2 of FIG. 2 with each other. It is thus not necessary to associate with these sensors expensive or sophisticated synchronization means as described in relation with FIG. 1.

The inventor has shown that the ratio between lengths $L_1$ and $L_2$ is equal to the ratio of the sum of the norms of the vectors of a phase diagram of pulse $s_1$ to the sum of the norms of the vectors of a phase diagram of pulse $s_2$.

It is here provided to detect pulses $s_1$ and $s_2$ and then to reconstruct their phase diagram and to calculate the above-mentioned ratio.

Figure 4:
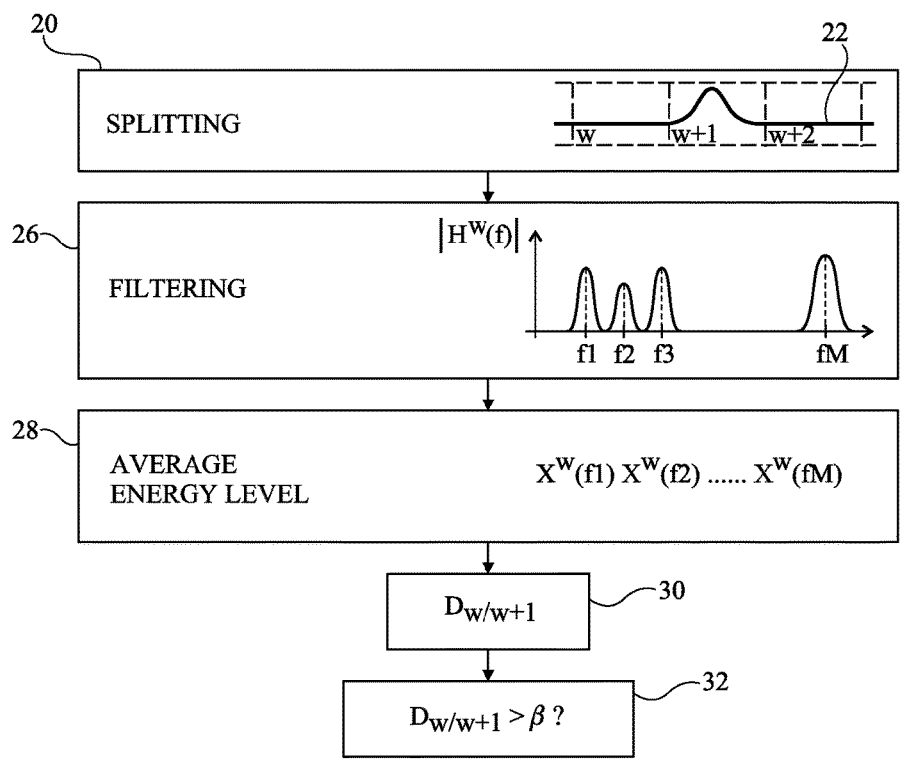
FIG. 4 illustrates a mode of pulse detection by the device of FIG. 2.

FIG. 4 schematically illustrates an example of a transient signal detection method.

At a step 20, a signal 22 received by sensors 1 or 2 is divided into portions (... W, W+1, W+2, ...) of a same duration. As an example, to detect a pulse having a width smaller than or equal to 1 μs, the duration of a portion is in the range from 5 to 25 μs, for example, 15 μs.

At a step 26, a filtering is applied to each portion W by an assembly of M bandpass filters, each having a different central frequency $f_j$, j being in the range from 1 to M.

At a step 28, an average level $X^W(f_j)$ is calculated for each frequency $f_j$ of each portion W. This average energy level may be obtained by associating an integrator circuit with each of the M filters.

At a step 30, for any pair of successive portions W and W+1, a spectral distance $D_{W/W+1}$ is calculated based on the following formula:

$$D_{W/W+1} = \sqrt{\left(\sqrt{\sum_{i=1}^{M}(X^{W+1}(f_j))^2} - \sqrt{\sum_{i=1}^{M}(X^W(f_j))^2}\right)^2}$$

At a step 32, the spectral distance $D_{W/W+1}$ is compared with a threshold β set in a prior calibration step. One can deduce from the fact that $D_{W/W+1}$ becomes greater than β that portion W+1 contains a signal other than noise (a pulse).

Figure 5A:
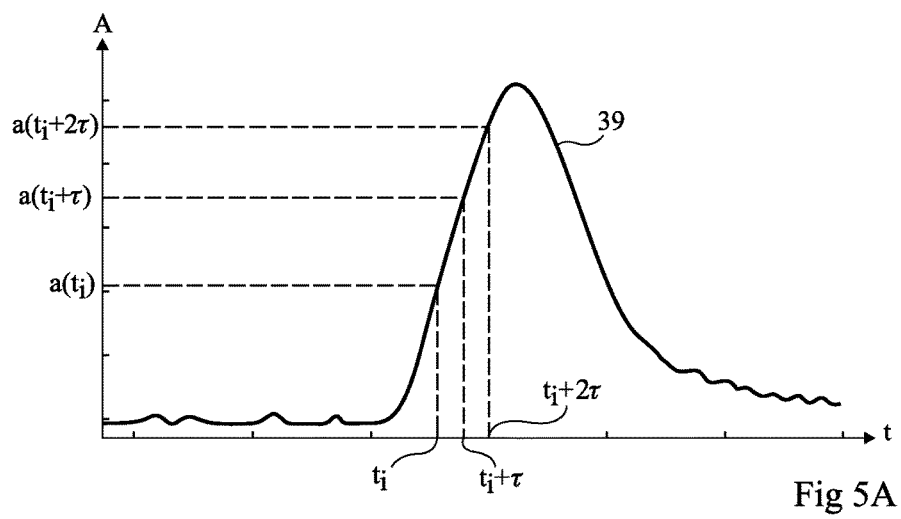
FIGS. 5A and 5B respectively show a pulse and a phase diagram corresponding to this pulse.
Figure 5B:
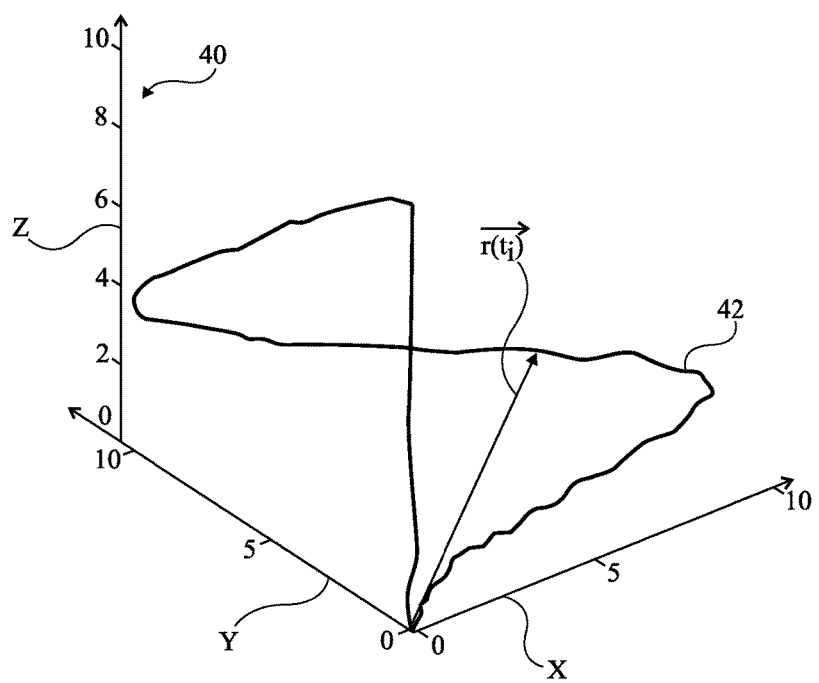

FIGS. 5A and 5B illustrate the construction of a phase diagram (shown in FIG. 5B) from the amplitude of a pulse (shown in FIG. 5A). The construction of a phase diagram from a signal is disclosed in chapter 3, pages 30 to 46, of the second edition of book "Non-linear Time Series Analysis" by Holger Kantz and Thomas Schrieber published in 2004 by Cambridge University Press.

FIG. 5A shows the amplitude A of a pulse 39 versus time t. Pulse 39 is regularly sampled with a pitch τ at successive times $t_i$ having amplitudes $a(t_i)$ corresponding thereto.

FIG. 5B shows an orthonormal coordinate system 40 with axes X, Y, and Z. Referring to FIG. 5A, a vector $\vec{r(t_i)}$ may be associated with each sampling time $t_i$ such that the coordinates of vector $\vec{r(t_i)}$ along the three axes X, Y, and Z correspond to $a(t_i)$, $a(t_i+\tau)$, and $a(t_i+2\tau)$ that is, to the amplitudes of pulse 39 at sampling times $t_i$, $t_i+\tau$, and $t_i+2\tau$.

The set of vectors $\vec{r(t_i)}$ forms, in coordinate system 40, phase diagram 42 of pulse 39. As an example, to determine a phase diagram of a pulse having a width smaller than or equal to 1 μs, sampling pulse τ is in the range from 1 to 50 ns, for example, 20 ns (that is, a 50-MHz sampling frequency).

In the described example, vectors $\vec{r(t_i)}$ have three dimensions. Generally, vectors $\vec{r(t_i)}$ may be associated with a number D of sampling times in a D-dimensional coordinate system, D≥2.

Figure 6A:
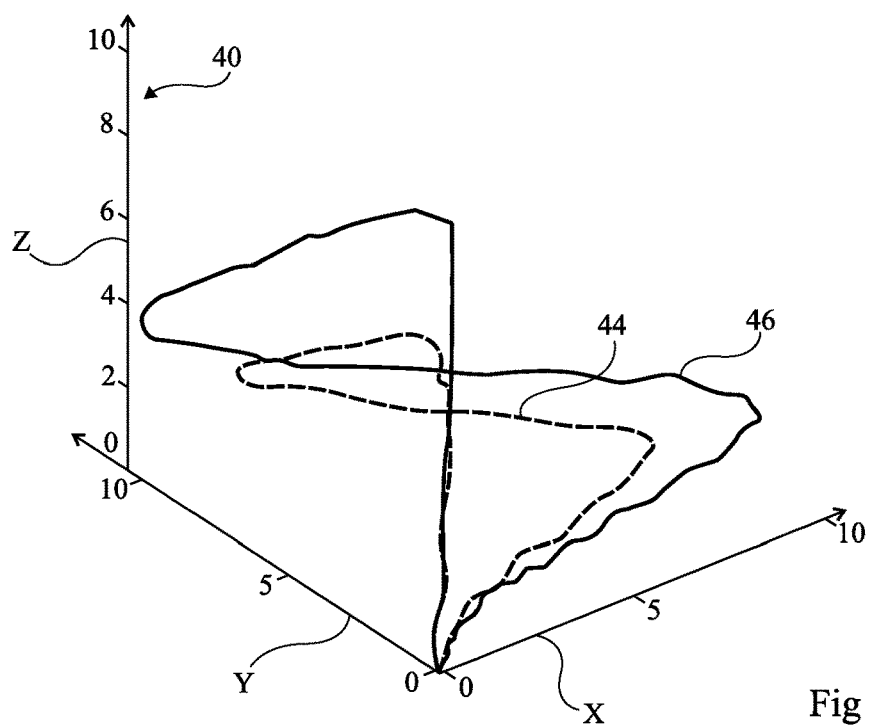
FIGS. 6A and 6B are respectively phase diagrams of two pulses and a projection on a plane of the diagrams.

FIG. 6A shows two phase diagrams 44 and 46 respectively associated with pulses $s_1$ and $s_2$. Phase diagram 44 is formed of the N vectors $\vec{r_1(t_i)}$ determined from pulse $s_1$. Phase diagram 46 is formed of the N vectors $\vec{r_2(t_i)}$ determined from pulse $s_2$. Phase diagram 46 is substantially an enlargement of phase diagram 44.

Figure 6B:
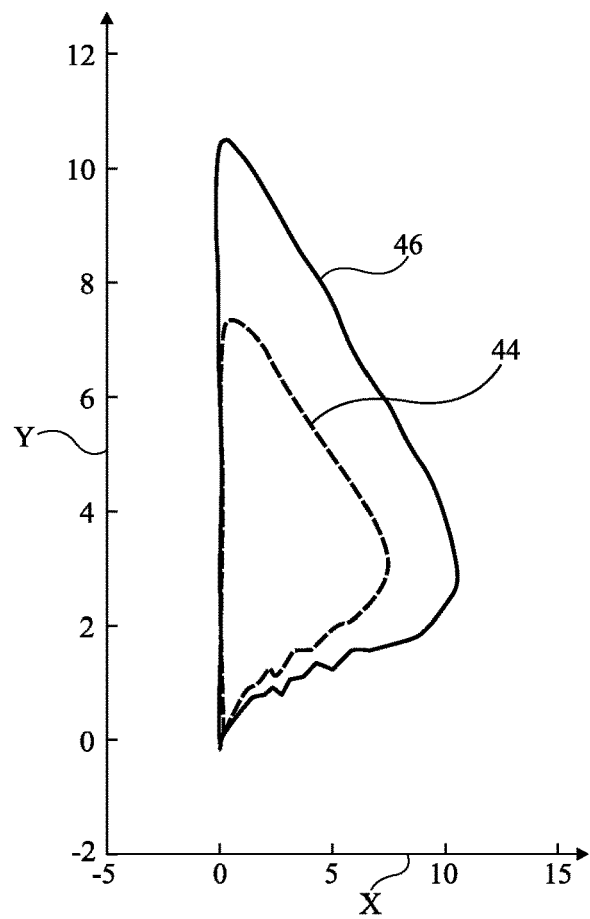

In FIG. 6B, phase diagrams 44 and 46 have been projected on plane XY of FIG. 6A to better highlight the fact that phase diagram 46 is substantially an enlargement of phase diagram 44.

As previously indicated, the ratio between distances $L_1$ and $L_2$ is equal to the ratio of the sum of the norms of the vectors of a phase diagram of pulse $s_1$ to the sum of the norms of the vectors of a phase diagram of pulse $s_2$. In other words:

$$L_1/L_2 = \sum_{i=1}^{N} |\vec{r_1(t_i)}| \Big/ \sum_{i=1}^{N} |\vec{r_2(t_i)}|$$

where $|\vec{r_1(t_i)}|$ and $|\vec{r_2(t_i)}|$ are the norms of vectors $\vec{r_1(t_i)}$ and $\vec{r_2(t_i)}$.

Laboratory tests have been carried out by the inventor and show that such a method enables a pulse source to be located with a better accuracy than in the case of a method based on differences of times of arrival of pulses at the level of sensors. As an example, when sensors are arranged on a coaxial cable, 300 m away from each other, the position of a pulse source is determined with an error of only 1.024 m, and not 25.6 m as in the case of FIG. 1.

Specific embodiments have been described. Various alterations and modifications will occur to those skilled in the art. In particular, although an embodiment has been described in the case of electric pulses propagating in an electric cable, it should be recalled that the method applies to any type of dispersive environment, be it guided or not, and to different natures of signals. In the case of a non-guided dispersive environment, the phase diagrams of pulses detected at the level of at least three sensors enable to calculate ratios between the distances from the source to each of the pairs of sensors. The exact position of the source can then be deduced from such ratios by triangulation.

Further, the method has been described in the case where sensors are located on either side of a pulse source. They may also be arranged on the same side of a source.

The invention claimed is:

1. A method of locating in a dispersive environment a source of pulses with at least a pair of sensors, the method comprising the steps of:
    positioning a pair of sensors in the dispersive environment, the pair of sensors being located at a predetermined distance L to each other;
    detecting a pulse at the level of each sensor originating from the source;
    constructing a phase diagram for each of said pulses from N vectors having their coordinates corresponding to the amplitude of the pulse at a sampling time $t_i$ and at next successive sampling times; and
    calculating the ratio for each pair of sensors between distances L1 and L2 from each sensor to the source with formula:

$$L_1/L_2 = \sum_{i=1}^{N} |\vec{r_1(t_i)}| \Big/ \sum_{i=1}^{N} |\vec{r_2(t_i)}|$$

where $|\vec{r_1(t_i)}|$ and $|\vec{r_2(t_i)}|$ are the norms of vectors $\vec{r_1(t_i)}$ and $\vec{r_2(t_i)}$ of the phase diagrams corresponding to the pulses detected by the sensors so that the source is located by the phase diagrams without synchronization of the sensors;
    wherein the calculated location of the source is communicated to specify the location of a maintenance operation.

2. The method of claim 1, wherein the dispersive environment is a guided environment.

3. The method of claim 2, wherein the dispersive environment is an electric cable.

4. The method of claim 3, wherein the coordinates of the vectors of the phase diagrams correspond to three successive sampling times.

5. The method of claim 3, wherein the detection of a pulse at the level of each sensor comprises the steps of:
    dividing a signal received by the sensor into portions of same duration;
    filtering each portion with a plurality M of bandpass filters having different central frequencies $f_j$;
    calculating an average energy level associated with each frequency $f_j$ of a portion;
    calculating a spectral distance DW/W+1 between a first and a second successive portions; and
    comparing spectral distance DW/W+1 with a threshold.

6. The method of claim 5, wherein the value of the threshold is set during a previous sampling state.

7. The method of claim 2, wherein the coordinates of the vectors of the phase diagrams correspond to three successive sampling times.

8. The method of claim 2, wherein the detection of a pulse at the level of each sensor comprises the steps of:
    dividing a signal received by the sensor into portions of same duration;
    filtering each portion with a plurality M of bandpass filters having different central frequencies $f_j$;
    calculating an average energy level associated with each frequency $f_j$ of a portion;
    calculating a spectral distance DW/W+1 between a first and a second successive portions; and
    comparing spectral distance DW/W+1 with a threshold.

9. The method of claim 1, wherein the coordinates of the vectors of the phase diagrams correspond to three successive sampling times.

10. The method of claim 1, wherein the coordinates of the vectors of the phase diagrams correspond to three successive sampling times.

11. The method of claim 10, wherein the detection of a pulse at the level of each sensor comprises the steps of:
   dividing a signal received by the sensor into portions of same duration;
   filtering each portion with a plurality M of bandpass filters having different central frequencies $f_j$;
   calculating an average energy level associated with each frequency $f_j$ of a portion;
   calculating a special distance DW/W+1 between a first and a second successive portions; and
   comparing spectral distance DW/W+1 with a threshold.

12. The method of claim 11, wherein the value of the threshold is set during a previous sampling state.

13. The method of claim 1, wherein the detection of a pulse at the level of each sensor comprises the steps of:
   dividing a signal received by the sensor into portions of a same duration;
   filtering each portion with a plurality of M bandpass filters having different central frequencies fj;
   calculating an average energy level associated with each frequency fj of a portion;
   calculating a spectral distance DW/W+1 between first and second successive portions; and
   comparing the spectral distance DW/W+1 with a threshold.

14. The method of claim 12, wherein the value of the threshold is set during a prior sampling step.

15. The method of claim 14, wherein spectral distance DW/W+1 is calculated based on the following formula:

$$D_{W/W+1} = \sqrt{\left(\sqrt{\sum_{i=1}^{M}(X^{W+1}(f_j))^2} - \sqrt{\sum_{i=1}^{M}(X^{W}(f_j))^2}\right)^2}$$

where $X^{W}(f_j)$ and $X^{W+1}(f_j)$ are the average energy levels corresponding to frequency $f_j$ respectively of the first portion and of the second portion.

16. The method of claim 13, wherein spectral distance DW/W+1 is calculated based on the following formula:

$$D_{W/W+1} = \sqrt{\left(\sqrt{\sum_{i=1}^{M}(X^{W+1}(f_j))^2} - \sqrt{\sum_{i=1}^{M}(X^{W}(f_j))^2}\right)^2}$$

where $X^{W}(f_j)$ and $X^{W+1}(f_j)$ are the average energy levels corresponding to frequency $f_j$ respectively of the first portion and of the second portion.

17. The method of claim 12, wherein the duration of a portion is in the range from 5 to 15 μs.

18. The method of claim 1, wherein each step separating two successive sampling times is in the range from 1 to 50 ns.

19. The method of claim 1, wherein the source is located by a pair of sensors, distance L between sensors being known.

20. The method of claim 1, wherein three sensors are positioned at predetermined distances from each other in a non-guided dispersive environment, and the three dimensional position of the source is deduced by triangulation of the phase diagrams of the three sensors.

* * * * *